United States Patent [19]

Shibib

[11] Patent Number: 5,360,987
[45] Date of Patent: Nov. 1, 1994

[54] SEMICONDUCTOR PHOTODIODE DEVICE WITH ISOLATION REGION

[75] Inventor: Muhammed A. Shibib, Wyomissing Hills, Pa.

[73] Assignee: AT&T Bell Laboratories, Murray Hill, N.J.

[21] Appl. No.: 155,610

[22] Filed: Nov. 17, 1993

[51] Int. Cl.⁵ ............................................. H01L 27/14
[52] U.S. Cl. .................................. 257/446; 257/458; 257/461; 257/465; 257/519; 257/548
[58] Field of Search ............... 257/462, 461, 465, 458, 257/446, 545, 548, 513, 514, 515, 519

[56] References Cited

U.S. PATENT DOCUMENTS

| | | |
|---|---|---|
| 4,961,097 | 10/1990 | Pirastehfar et al. ............... 257/461 |
| 5,239,193 | 8/1993 | Benton et al. ............... 257/465 X |

FOREIGN PATENT DOCUMENTS

| | | | |
|---|---|---|---|
| 57-100761 | 6/1982 | Japan ............................ 257/446 |
| 59-198756 | 1/1984 | Japan . | |
| 62-123783 | 6/1987 | Japan ............................ 257/461 |
| 0242767 | 2/1990 | Japan ............................ 257/458 |
| 0242768 | 2/1990 | Japan ............................ 257/458 |
| 2246168 | 10/1990 | Japan ............................ 257/462 |

OTHER PUBLICATIONS

"High Voltage Solid State Relays for Telecommunications", J. C. Gammel, Electro, Session 24, pp. 1-4 (1986).

*Primary Examiner*—William Mintel

[57] ABSTRACT

A dielectrically isolated photodiode having an increased p-n junction size with improved photo-carrier collection efficiency. The photodiode comprises a first layer of semiconductor material formed on the bottom and the walls of an isolation region; a second layer of semiconductor material formed on the first layer. The second layer forming a first p-n junction with the first layer and having opposite conductivity type compared to that of the first layer. The photodiode also comprises a third layer of semiconductor material formed on the second layer and electrically coupled to the first layer. The third layer having the same conductivity type as the first layer and forming a second p-n junction with the second layer. During operation, the first p-n junction functions to collect photo-generated carriers that extend to the bottom and walls of the isolation region, thereby increasing the active collecting p-n junction area per isolation region area to improve efficiency of the photodiode.

12 Claims, 2 Drawing Sheets

SEMICONDUCTOR PHOTODIODE DEVICE WITH ISOLATION REGION

BACKGROUND OF THE INVENTION

1. Field of the Invention

The present invention relates to the field of semiconductor devices, and more particularly, to a photodiode deivce in dielectrically isolated and silicon-on-insulator structures having improved photo-carrier collection efficiency.

2. Related Art

Optically coupled solid state relays, such as those used in telecommunications signalling, use a light emitting diode (LED) and a stack of photodiodes to control a high-voltage switch. Several conventional approaches to solid-state relays are discussed by J.C. Gammel in an article titled, "High-Voltage Solid State Relays for Telecommunications" (*Electro*, Section 24, pp. 1–4, 1986).

The LEDs commonly used in solid state relays emit light in or near the infra-red region of the electromagnetic spectrum. Infra-red light of this wavelength penetrates the silicon to a depth of between 30–60 micrometers. The efficiency of the photodiode, which is primarily determined by the short-circuit current under illumination is a critical parameter. The efficiency of the photodiode determines the silicon area required to provide a specific drive capability for the high-voltage switch of the solid-state relay.

In accordance with the design criteria of nearly all solid-state devices, what is desired is a photodiode structure with an improved drive capability which minimizes the silicon area required to implement such a device.

SUMMARY OF THE INVENTION

The inventors have conceived and reduced to practice a new semiconductor photodiode device structure having an increased p-n junction size with improved photo-carrier collection efficiency. For photodiodes formed in dielectric isolated tubs or silicon-on-insulator structures, the inventors have extended the collecting p-n junction to the "back" side of the photodiode to collect photo-carriers before they can recombine.

The increased photo-carrier collection efficiency of the present invention increases the drive capability of the photodiode while minimizing the silicon area necessary to form the device itself. Thus, compared to a conventional solid-state relay photodiode, the silicon area for a photodiode of the present invention can be reduced while achieving the same drive capability of conventional photodiodes. Alternatively, the photodiode of the present invention can achieve a higher drive capability using the same silicon area of conventional photodiodes.

In a second embodiment of the present invention, rather than a wrap-around backside cathode region, a separate p-n junction is formed at the backside of the phodiode. This separate backside p-n junction does not fully extend up the walls of the isolation tub. Nor is the backside p-n junction electrically connected to the collecting p-n junction at the topside of the phodiode. Under zero external bias conditions, the backside p-n junction provides a large built-in electric field that separates electron-hole pairs at the backside, allowing for their collection by the topside p-n junction. This structure provides higher short circuit current and has higher efficiency than conventional photodiode structures.

Using a double-diffused MOS (DMOS) process, either photodiode of the present invention may be easily integrated with a high-voltage switch such as an isolated gate bipolar transistor (IGBT). The resulting solid-state relay has improved current switching capability due to the photodiode's drive capability.

BRIEF DESCRIPTION OF THE DRAWINGS

The invention will be better understood if reference is made to the accompanying drawings in which.

DETAILED DESCRIPTION OF THE PREFERRED EMBODIMENT

The preferred embodiment of the present invention is discussed in detail below. While specific steps, configurations and arrangements are discussed, it should be understood that this is done for illustration purposes only. A person skilled in the relevant art will recognize that other steps, configurations and arrangements may be used without departing from the spirit and scope of the invention.

Further, background material concerning semiconductor solid-state physics may be found in a number of references including two books by S. M. Sze, titled: *Physics of Semiconductor Devices*, John Wiley and Sons, Inc., New York (1981), and *Semiconductor Devices, Physics and Technology*, John Wiley and Sons, Inc., New York (1985), both of which are incorporated herein by reference.

The preferred embodiment of the invention is now described with reference to the figures where like reference numbers indicate identical or functionally similar features. Also in the figures, the left-most digit of each reference number corresponds to the figure in which the reference number is first used.

Figure 1:
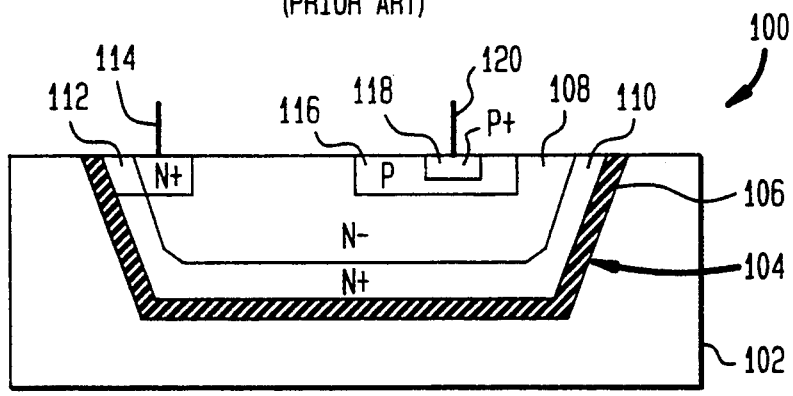
FIG. 1 shows a conventional photodiode.

FIG. 1 shows a conventional photodiode used in optically-coupled solid-state relays, for example. A conventional photodiode 100 is supported by a substrate 102 in a tub 104. Dielectric isolation 106 is provided to electrically isolate photodiode 100 from adjacent devices formed on substrate 102. The substrate 102 may comprise polycrystaline silicon (Si), a crystalline semiconductor (e.g., Si) or an insulator. The dielectric isolation 106 may comprise $SiO_2$, $Si_2N_3$, or the like.

The photodiode 100 comprises a lightly doped (N−) cathode region 108, a heavily doped (N+) cathode region 110, a heavily doped (N+) cathode contact region 112 and a cathode electrode contact 114. In this example, the cathode regions 108, 110 and 112 are formed on N-type doped Si.

The photodiode 100 also comprises a moderately doped (P) anode region 116, a heavily doped (P+) anode contact region 118 and an anode electric contact 120. In this example, the anode regions 116 and 118 are formed of P-type doped Si. As would be apparent to a person skilled in the relevant art, the connectivity types discussed in FIG. 1 (as well as those in the following figures), may be reversed. Methods for making the photodiode 100 would be apparent to a person skilled in the relevant art.

The photodiode 100 is basically a p-n junction operated under no external bias. When an optical signal (not shown) impinges on the photodiode 100, electron-hole pairs are generated. A depletion layer (not shown) at the p-n junction serves to separate photogenerated electron-hole pairs. As a result, an electric current is generated by the photodiode. This electric current is characterized as conventional hole current that flows out of the photodiode via the anode electric contact 120.

Figure 2:
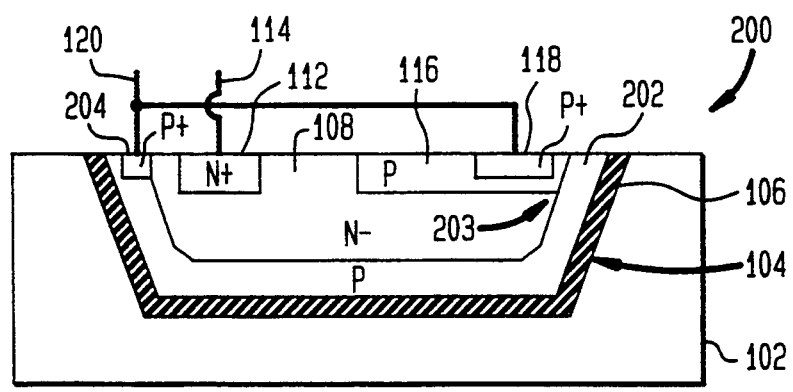
FIG. 2 shows a photodiode in connection with a first embodiment according to the present invention.

A photodiode 200 according the present invention is shown in FIG. 2. The inventors have replaced the cathode layer 110 with a "backside" wrap-around anode region 202 that wraps-around the walls and bottom of the tub 104. According to the present invention, the backside anode region 202 increases the effective size of the p-n junction formed between the anode region 116 and the cathode region 108. The backside anode region 202 is electrically coupled to anode region 116 near the top of photodiode 200 where the two regions are adjacent one another, as shown generally at 203. Additional electrical contact is made to backside anode region 202 via a backside anode contact region 204, which in turn is electrically coupled to anode contact region 118 via the anode electrode contact 120.

The backside anode region 202 and backside anode contact region 204 are both formed of like type conductivity (e.g., P-type) as the anode region 116 and anode contact region 118. Backside anode region 202 is moderately doped (P), and the backside anode contact region 204 is heavily doped (P+) for proper electrical contact to region 202.

The photodiode 200 according to the present invention can more efficiently collect photogenerated carriers (electron-hole pairs) because the collecting p-n junction is extended to the backside of the device. The anode region 116 is effectively extended down the walls and across the bottom of the tub 104, thus increasing the effective size of the collecting p-n junction.

In the new structure according to the invention, the cathode region 110 is eliminated and the cathode contact region 112 is shifted away from the wall of the tub 104. Also note that the anode region 116 is extended to the wall of tub 104 in order to contact the new backside anode region 202.

The addition of the backside anode region 202 almost doubles the active collecting p-n junction area per given dielectrically isolated tub size. The backside anode region 202 makes effective use of the carriers generated toward the backside by collecting them before they recombine.

Figure 3:
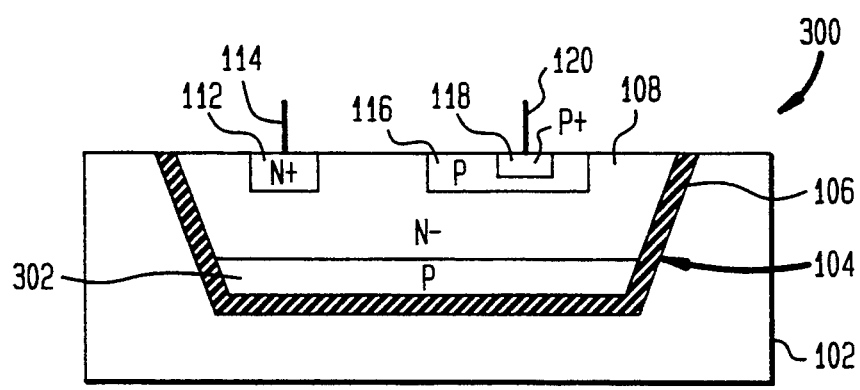
FIG. 3 shows a photodiode in connection with a second embodiment according to the present invention.

Another embodiment of the present invention will now be discribed with reference to FIG. 3. A photodiode 300 of FIG. 3 includes a backside layer 302 which is not fully extended up the walls of the tub 104. In addition, the backside layer 102 is not connected to the anode region 116 by a low resistance region. As in the embodiment shown in FIG. 2, the photodiode 300 does not include a cathode region 110. The backside layer of 302 is lightly doped and of the same connectivity as the anode region 116 and anode contact region 118.

Under zero external bias conditions, the backside layer 302 froms a p-n junction with layer 108. This second p-n junction provides a large built-in electric field that separates the generated electron-hole pairs at the backside, allowing for their collection by the topside p-n junction formed by layers 116 and 108. The backside layer 302 provides the photodiode 300 with a higher short-circuit current, and thus, a higher efficiency than the conventional photodiode discussed above.

Photodiodes 200 and 300 according to the present invention can also be formed in silicon-on-insulator (SOI) type structures having vertical trenches. The v-groove etching techniques required for dielectric isolation (DI) as shown in FIGS. 1-3, as well as the SOI structures, would be apparent to a person skilled in the relevant art. Although the techniques for manufacturing photodiodes 200 and 300 of the present invention would be apparent to a person skilled in the relevant art, the combinations of steps to form photodiodes 200 and 300 are new.

According to the present invention, the following method steps constitute a representative example of how to form photodiode 200: forming a substrate (102); forming an isolation region (104) in the substrate, wherein the isolation region has a bottom and walls; forming a first layer (202) of semiconductor material on the bottom and the walls of the isolation region, wherein the first layer has a first conductivity type (e.g., P); forming a second layer (108) of semiconductor material on the first layer, the second layer having a second conductivity type (e.g., N) opposite to the first conductivity type, wherein a first p-n junction is formed between the first and second layers; forming a third layer (116) of semiconductor material on the second layer, wherein the third layer of semiconductor has the conductivity type of the first layer, and wherein a second p-n junction is formed between the second and third layers; and electrically coupling the third layer to the first layer. During operation, the first p-n junction functions to collect photo-generated carriers that extend to the bottom and walls of the isolation region, thereby increasing collecting p-n junction area per isolation region area to improve efficiency of the photodiode.

In addition, the following method steps constitute a representative example of how to form photodiode 300; forming a substrate (102); forming an isolation region (104) in the substrate, wherein the isolation region has a bottom and walls; forming a first layer (302) of semiconductor material on the bottom of the isolation region, wherein the first layer has a first conductivity type (e.g., P); forming a second layer (108)of semiconductor material on the first layer, wherein the second layer has a second conductivity type (e.g., N) opposite to the first conductivity type, and wherein a first p-n junction is formed between the first and second layers; and forming a third layer (116) of semiconductor material on the second layer, wherein the third layer of semiconductor has the conductivity type of the first layer, and wherein a second p-n junction is formed between the second and third layers. During operation, the first layer provides a built-in electric field that directs electron-hole pairs away from the bottom of the isolation region, thereby increasing electron-hole pair collection efficiency of the second p-n junction.

Figure 4:
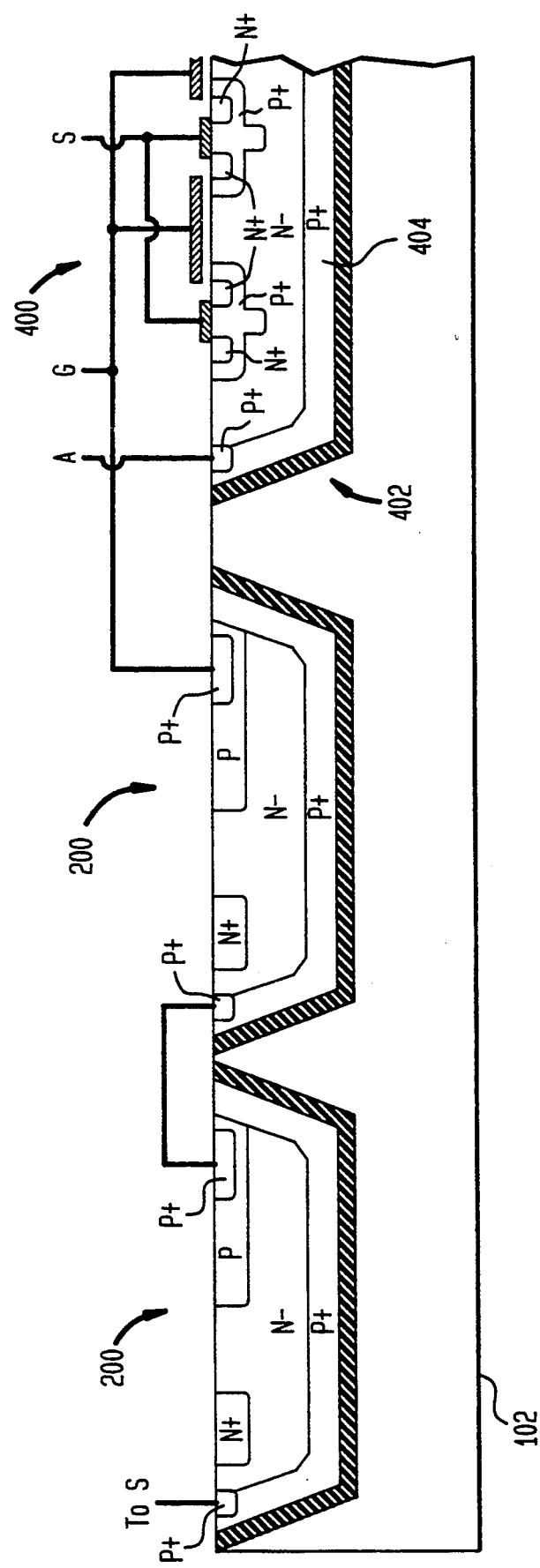
FIG. 4 shows an optically-coupled solid-state relay having an improved photodiode and insulated gate bipolar transistor in accordance with the present invention.

Finally, an implementation example of photodiode 200 is shown in FIG. 4. Two photodiodes 200 according to the present invention are integrated within an insulated gate bipolar transistor (IGBT) 400. The IGBT 400 is isolated from photodiodes 200 by an isolation tub 402. In a method according to the present invention, the IGBT 400 is also formed with a wrap-around layer 404 of P+-type conductivity. Region 404 is formed simultaneously with regions 202 of photodiodes 200.

While various embodiments of the present invention have been described above, it should be understood that they have been presented by way of example, and not limitation. It will be apparent to persons skilled in the relevant art that various changes in form and detail may be made therein without departing from the spirit and scope of the invention. Thus, the present invention should not be limited by any of the above-described exemplary embodiments, but should be defined only in accordance with the following claims and their equivalents. All cited patent documents and publications in the above description are incorporated herein by reference.

What is claimed is:

1. A photodiode in an isolation region of a substrate, the isolation region having a bottom and walls, the photodiode comprising:

a first layer of semiconductor material formed on the bottom and the walls of the isolation region, said first layer having a first conductivity type;

a second layer of semiconductor material formed on said first layer, said second layer having a second conductivity type opposite to said first conductivity type and forming a first p-n junction with said first layer; and a third layer of semiconductor material formed on said second layer and electrically coupled to said first layer, said third layer of semiconductor having said first conductivity type and forming a second p-n junction with said second layer;

wherein during operation, said first p-n junction functions to collect photo-generated carriers that extend to the bottom and walls of the isolation region, thereby increasing collecting p-n junction area per isolation region area to improve efficiency of the photodiode.

2. The photodiode according to claim 1, wherein said first conductivity type is P and said second conductivity type is N.

3. The photodiode according to claim 1, wherein said first conductivity type is N and said second conductivity type is P.

4. The photodiode according to claim 1, wherein the substrate is polysilicon and the isolation region comprises dielectric isolation having non-vertical walls.

5. The photodiode according to claim 1, wherein the substrate is insulating and the isolation region is formed between vertical isolation trenches.

6. The photodiode according to claim 1, wherein the substrate is a crystalline semiconductor.

7. A photodiode in an isolation region of a substrate, the isolation region having a bottom and walls, the photodiode comprising:

a first layer of semiconductor material formed on the bottom of the isolation region, said first layer having a first conductivity type and a first dopant concentration level;

a second layer of semiconductor material formed on said first layer, said second layer having a second conductivity type opposite to said first conductivity type and forming a first p-n junction with said first layer; and a third layer of semiconductor material formed on said second layer, said third layer of semiconductor having said first conductivity type, a second dopant concentration level higher than said first dopant concentration level and forming a second p-n junction with said second layer;

wherein during operation, said first layer provides a built-in electric field that directs electron-hole pairs away from the bottom of the isolation region, thereby increasing electron-hole pair collection efficiency of said second p-n junction.

8. The photodiode according to claim 7, wherein said first conductivity type is P and said second conductivity type is N.

9. The photodiode according to claim 7, wherein said first conductivity type is N and said second conductivity type is P.

10. The photodiode according to claim 7, wherein the substrate is polysilicon and the isolation region comprises dielectric isolation having non-vertical walls.

11. The photodiode according to claim 7, wherein the substrate is insulating and the isolation region is formed between vertical isolation trenches.

12. The photodiode according to claim 7, wherein the substrate is a crystalline semiconductor.

* * * * *